United States Patent
Vashchenko et al.

(10) Patent No.: US 7,394,133 B1
(45) Date of Patent: Jul. 1, 2008

(54) DUAL DIRECTION ESD CLAMP BASED ON SNAPBACK NMOS CELL WITH EMBEDDED SCR

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/216,774

(22) Filed: Aug. 31, 2005

(51) Int. Cl.
*H01L 29/72* (2006.01)
(52) U.S. Cl. ..................................... 257/355
(58) Field of Classification Search ................. 257/355
See application file for complete search history.

(56) References Cited

U.S. PATENT DOCUMENTS

| | | | | |
|---|---|---|---|---|
| 6,399,990 | B1 * | 6/2002 | Brennan et al. | 257/355 |
| 6,406,953 | B1 * | 6/2002 | Li et al. | 438/199 |
| 2003/0071310 | A1 * | 4/2003 | Salling et al. | 257/355 |
| 2004/0155300 | A1 * | 8/2004 | Baird et al. | 257/380 |
| 2005/0224882 | A1 * | 10/2005 | Chatty et al. | 257/355 |

* cited by examiner

*Primary Examiner*—Thomas L Dickey
(74) *Attorney, Agent, or Firm*—Jurgen Vollrath

(57) ABSTRACT

In an ESD protection structure, dual direction ESD protection is provided by forming an n-well isolation ring around an NMOS device so that the p-well in which the NMOS drain is formed is isolated from the underlying p-substrate by the n-well isolation ring. By forming the n-well isolation ring the p-n-p-n structure of an embedded SCR for reverse ESD protection is provided. The width of the n-well isolation ring and its spacing from the NMOS drain are adjusted to provide the desired SCR parameters.

14 Claims, 2 Drawing Sheets

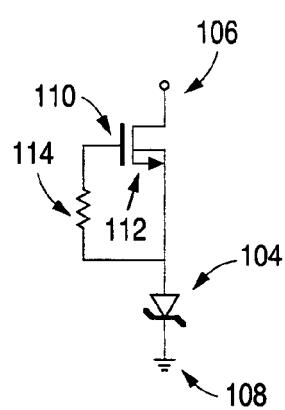
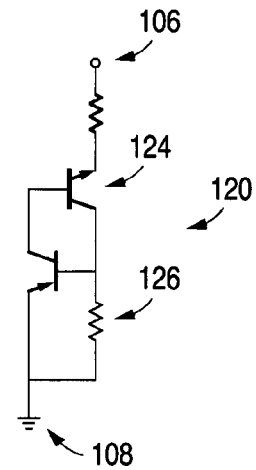
FIG. 1  FIG. 2
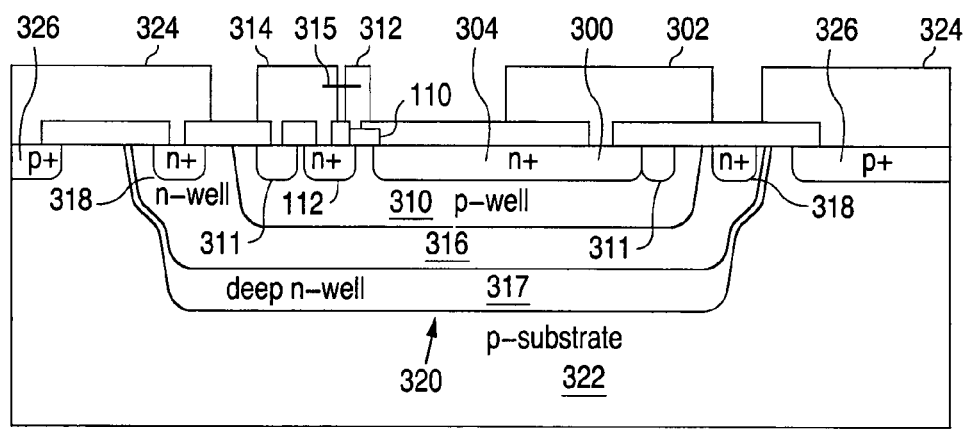
FIG. 3

DUAL DIRECTION ESD CLAMP BASED ON SNAPBACK NMOS CELL WITH EMBEDDED SCR

FIELD OF THE INVENTION

The invention relates to dual direction ESD clamps. In particular, it relates to dual direction ESD clamps provided in a CMOS process.

BACKGROUND OF THE INVENTION

A number of analog applications, such as display column drivers, level shifters and circuits used in the automotive industry require dual direction voltage tolerance. ESD clamps such as snapback NMOS devices and SCRs work well in providing forward ESD protection but do not provide a current path when reverse biased. The present invention seeks to provide a structure that will provide a current path both when the device is forward biased as well as when it is reverse biased.

SUMMARY OF THE INVENTION

The invention provides a snapback NMOS cell with an embedded SCR, wherein the NMOS cell provides forward ESD protection and the SCR provides reverse ESD protection.

According to the invention, there is provided a dual direction ESD protection structure comprising an NMOS that includes a drain, a source, and a gate formed in a p-well, and further comprising an n-well isolation ring with n+ diffusion that isolates the p-well from an underlying p-substrate and forms an p-n-p-n SCR structure with the p-substrate, the p-well and the drain. The p-well will be referred to herein as the isolated p-well. The drain preferably includes a drain ballasting region (which is an unsilicided drain region). The source and substrate typically include a source contact region and a substrate contact region, respectively and the gate typically includes a gate contact region. The p-substrate is typically grounded. The n-well isolation ring with n+ diffusion, may be an n-well/deep n-well combination with n+ diffusion, and is preferably electrically connected to the p-substrate. The source and isolated p-well are also typically connected together, e.g. by a floating backend, to define a floating node. The gate may also be connected to the floating node, preferably through a resistor to provide dynamic coupling between the gate and the source.

The n-well isolation ring forms a reverse biased diode with the isolated p-well when the NMOS is reverse biased, and is forward biased when the NMOS is forward biased. In order to provide the desired parameters for the SCR protection structure for reverse bias conditions (when the drain, which is connected to the pad is negatively biased), the present invention further provides for placing at least a portion of the isolated p-well and n-well isolation ring adjacent the drain so as to define with the p-substrate, the p-n-p-n structure of an SCR, and adjusting the width of the n-well isolation ring and the spacing between the isolated p-well and the n-well isolation ring. The SCR comprising the p-substrate, the n-well isolation ring, the isolated p-well, and the drain, provides the protection structure during reverse bias conditions.

BRIEF DESCRIPTION OF THE DRAWINGS

FIG. 1 is a circuit diagram depicting the NMOS portion of the dual direction ESD protection structure of the invention, FIG. 2 is a circuit diagram depicting the SCR portion of the dual direction ESD protection structure of the invention FIG. 3 is a sectional side view of one embodiment of the a structure of the invention.

DETAILED DESCRIPTION OF THE INVENTION

Figure 4:
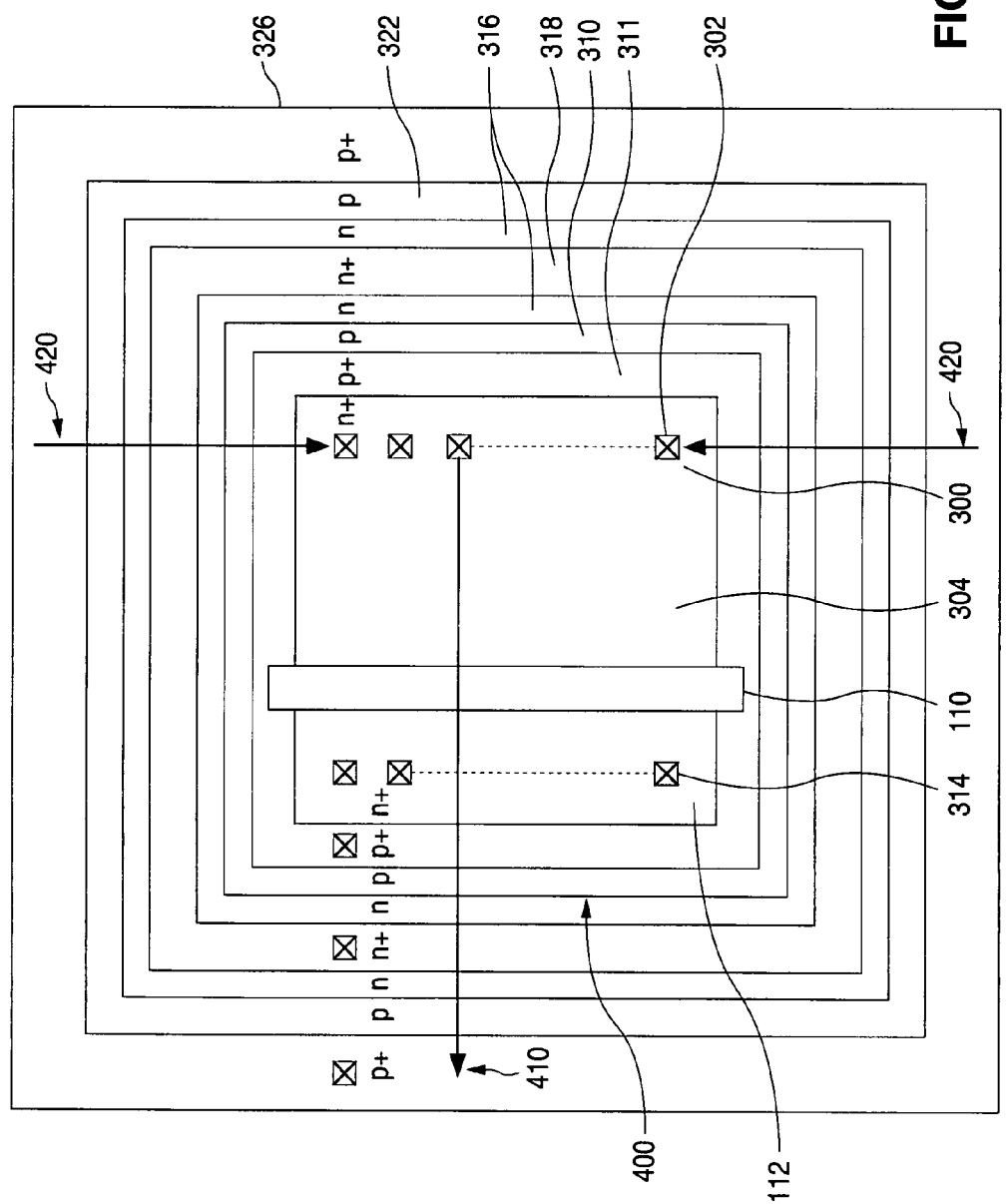
FIG. 4 is plan view of the structure of FIG. 3.

FIGS. 1 and 2 show schematic representations of the forward bias protection structure and the reverse bias protection structure, respectively of a dual direction ESD clamp of the invention.

The forward bias ESD protection structure comprises an NMOS device 102. The NMOS device 102 is shown connected in series with a diode 104, which is forward biased and thus does not interfere with the current path from the pad 106 to ground 108. (The purpose of the diode 104 will become clearer from the discussion below of the structure of the full dual direction ESD clamp.) As shown in FIG. 1, the drain of the NMOS device 102 is connected to the pad 106 and the source 112 is connected to ground via the diode 104. The gate 110 of the NMOS is connected to the source 112 through a resistor 114 so as to provide dynamic coupling between the gate and the source. The source 112 is also connected to the substrate of the device to define a high voltage tolerant NMOS structure. The substrate of the NMOS will be discussed in greater detail below with respect to the cross-sectional structural drawing of FIG. 3.

In order to provide a current path during reverse bias, when the drain is negatively biased, thereby reverse biasing the diode 104, an embedded SCR 120 is provided as shown in FIG. 2. In order to simplify the discussion the p-n-p-n structure of the SCR 120 is depicted as a pnp bipolar transistor 122 coupled to an npn bipolar transistor 124. The emitter of the pnp 122 is connected through resistor 126 to its base. The base of the pnp 122 is also connected to the collector of the npn 124, and the base of the npn 124 is, in turn, connected to the collector of the pnp 122. It will be appreciated that the two bipolar transistors will provide a current path between ground 108 and the pad 106 when the pad 106 is negatively biased relative to ground 108.

The structural details of one embodiment of the dual direction ESD clamp structure are shown in cross-sectional view in FIG. 3 and in plan view in FIG. 4. The NMOS device, which provides the forward bias protection, includes a drain 300 with drain contact region 302 and drain ballast region (unsilicided region) 304, which provides for current spreading when the NMOS goes into snapback. The drain 300 and source 112 are formed in a p-well 310, which forms the substrate for the NMOS device but will be referred to herein as the isolated p-well 310 for reasons that will become clearer below. The isolated p-well 310, which is also sometimes referred to as an R-well, includes p+ region 311 for contacting the p-well 310, as discussed further below. The gate 110 of the NMOS is provided with a floating gate contact region 312, while the source 112 is provided with a source contact region 314. The gate contact region 312 and source contact region 314 are connected by a large gate-source resistor 315 to provide for dynamic coupling of the gate potential during an ESD event. Also, as shown in FIG. 2, the source contact region 314 also contacts the p+ region 311, thereby connecting the source 112 and NMOS substrate (isolated p-well 310).

The present invention provides for additional backend changes and topology connections in order to achieve not only forward ESD protection but also protection against reverse biasing. An n-well 316/deep n-well 317 isolation ring with n+ diffusion 318 is provided between the p-well 310 and p-substrate 322. For ease of reference, the n-well/deep n-well with n+ diffusions will hereafter be referred to simply as an n-well isolation ring 320. This defines the p-n-p-n structure of an SCR. In particular, the p-substrate 322, n-well isolation ring 320, isolated p-well 310, and n-drain 300 define a p-n-p-n structure. This can be related to the schematic circuit diagram of FIG. 2 in which the pnp transistor 122 is defined by the p-substrate 322 as emitter, n-well isolation ring 320 as base, and isolated p-well 310 as collector. The npn transistor 124 is defined by the n-well isolation ring 310 as collector, isolated p-well 310 as gate, and n-drain 300 as emitter.

The SCR thus provides a blocking junction between the n-well isolation ring 320 and the isolated p-well 310 when the pad 106 (which is connected to the drain contact region 302) is exposed to a reverse ESD pulse. This blocking junction thus provides the blocking junction for the SCR 120 and is depicted in FIG. 2 by the pnp/npn transistor pair 122, 124.

It will be appreciated that as far as the NMOS device is concerned, during a negative ESD pulse the n-well isolation ring 320 also defines a reverse biased junction with the isolated p-well 310. This is depicted in FIG. 1 by the diode 104.

To avoid the n-well isolation ring 320 from interfering with the operation of the NMOS device during positive ESD pulses the n-well isolation ring 320 is electrically connected to the p-substrate 322 by a common contact region 324 connecting the n+ diffusion 318 of the n-well isolation ring 320 to a p+ diffusion 326 formed in the p-substrate 322. This maintains the n-well isolation ring 320 and p-substrate 322 at the same potential (typically ground potential).

As discussed above with respect to FIG. 1, the source 112 and isolated p-well 310 are connected together by a floating backend 314, which is also referred to above as the source contact region. This source contact region 314 contacts the n+ source 112 and the p+ region 311 of the isolated p-well 210. As mentioned above, the gate 110 is also connected to the same floating backend or source contact region 314 through a resistor 315 to provide for dynamic coupling between the gate 110 and the source 112.

Thus, under positive ESD stress, the NMOS 102 described above provides the ESD protection structure, while under negative ESD stress, the SCR 120 formed by the additional n-well isolation ring 320 provides the ESD protection structure. In other words, the present invention modifies the NMOS cell to achieve current clamping capabilities in the negative direction by providing an embedded SCR. This is achieved by forming the n-well isolation ring 320 and placing the drain 200 adjacent to the n-well isolation ring 320 and the substrate 322. By adjusting the spacing between the drain and the n-well isolation ring 320, and the thickness of the n-well isolation ring 320 the desired p-n-p-n parameters of an SCR can be achieved in which the p-substrate 222, n-well isolation ring 220, isolated p-well 210, and n-type drain 200 provide the necessary p-n-p-n configuration.

A plan view of the embodiment of FIG. 3 is shown in FIG. 4, which clearly shows the NMOS structure with its n+ drain 300 and drain contact regions 302, the n+ source 112 with its source contact regions 314, the gate 311, the isolated p-well 310 with its p+ contact region 311, the n-well isolation ring 320 with its n-well/deep n-well 316, 317 and n+ diffusion 318, and the p-substrate 322 with its p+ diffusion 326. Under forward ESD stress, the junction 400 between isolated p-well 310 and n-well/deep n-well 316, 317 is forward biased and current flows as shown by arrow 410. Under negative ESD stress, the SCR defined by p-substrate 322, n-well isolation ring (comprising n-well/deep n-well 314, 316), isolated p-well 310, and n-type drain 300 provides the conductivity modulation mechanism for current flow as shown by the arrows 420.

While the invention was described with respect to the one embodiment shown in FIGS. 3 and 4, it will be appreciated that the invention is not limited by the specific embodiment.

What is claimed is:

1. A dual direction ESD protection structure comprising an NMOS that includes a drain, a source, and a gate formed in a p-well, and
an n-well isolation ring that isolates the p-well from an underlying p-substrate, wherein the n-well isolation ring and p-substrate are connected to a common voltage by being connected together through a common contact region.

2. A structure of claim 1, wherein the drain includes a drain ballasting region.

3. A structure of claim 1, wherein the source and p-well are connected together.

4. A structure of claim 3, wherein the source and the p-well are connected together by a floating backend, to define a floating node.

5. A structure of claim 4, wherein the p-well includes a p+ diffusion for contacting the floating backend.

6. A structure of claim 4, wherein the gate is connected to the floating node through a resistor.

7. A structure of claim 1, wherein the n-well isolation ring includes an n-well/deep n-well combination with n+ diffusion.

8. A structure of claim 1, wherein the n-well isolation ring has an n+ diffusion and the p-substrate has a p+ diffusion for contacting the one or more contact regions.

9. A structure of claim 1, wherein the p-substrate is grounded.

10. A method of protecting against positive and negative ESD pulses, comprising
providing an NMOS that includes a drain, a source, and a gate formed in a p-well,
providing an n-well isolation ring that isolates the p-well from an underlying p-substrate,
connecting the n-well isolation ring to the p-substrate,
connecting the source and p-well together, and
adjusting at least one of the thickness of the n-well isolation ring and the spacing between the drain and the n-well isolation ring.

11. A method of claim 10, further comprising connecting the gate through a resistor to the source.

12. A method of claim 11, further comprising connecting the p-substrate to ground.

13. A method of claim 12, further comprising providing the drain with a drain ballast region.

14. A method of claim 10, further comprising providing the drain with a drain ballast region.

* * * * *